United States Patent
Ravi et al.

(10) Patent No.: US 12,021,964 B2
(45) Date of Patent: Jun. 25, 2024

(54) METHODS AND DEVICES FOR MITIGATING PULLING IN A FRACTIONAL LOCAL OSCILLATOR SIGNAL GENERATION SCHEME

(71) Applicant: Intel Corporation, Santa Clara, CA (US)

(72) Inventors: Ashoke Ravi, Portland, OR (US); Ronen Kronfeld, Shoham (IL); Ofir Degani, Haifa (IL)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/641,830

(22) PCT Filed: Dec. 27, 2019

(86) PCT No.: PCT/US2019/068638
§ 371 (c)(1),
(2) Date: Mar. 10, 2022

(87) PCT Pub. No.: WO2021/133398
PCT Pub. Date: Jul. 1, 2021

(65) Prior Publication Data
US 2024/0048351 A1    Feb. 8, 2024

(51) Int. Cl.
*H04L 7/033*    (2006.01)
(52) U.S. Cl.
CPC .................. *H04L 7/0331* (2013.01)
(58) Field of Classification Search
CPC .................................................. H04L 7/0331
See application file for complete search history.

(56) References Cited

U.S. PATENT DOCUMENTS 9,306,585 B1 * 4/2016 Elkholy .............. H03L 7/0814
2009/0015340 A1   1/2009 Dally et al.
(Continued)

FOREIGN PATENT DOCUMENTS

WO    2019032085 A1    2/2019
WO    2020139371 A1    7/2020

OTHER PUBLICATIONS

Alvin Li et al., A21-48GHz Subharmonic Injection-Locked Fractional-N Frequency Synthesizer for Multiband Point-to-Point Backhaul Communications, IEEE Journal of Solid-State Circuits, IEEE, vol. 49, No. 8, Aug. 1, 2014, pp. 1785-1799.

(Continued)

*Primary Examiner* — Freshteh N Aghdam
(74) *Attorney, Agent, or Firm* — Viering, Jentschura & Partner mbB; Samuel Y. Lo

(57) ABSTRACT

A radio-frequency integrated circuit (RFIC) configured to generate a synthesized clock includes a phase locked loop (PLL) configured to divide down a clock to a non-harmonic frequency; a plurality of multi-phase injection locked clock multipliers (ILCM) directly connected to a plurality of transceiver chains; wherein the PLL is further configured to distribute a divided down clock to at least one of the plurality of multi-phase ILCMs; wherein the plurality of multiphase ILCMs are configured to select a phase of and multiply the divided down clock to synthesize a desired harmonic frequency of the clock and suppress an undesired harmonic frequency of the clock.

20 Claims, 8 Drawing Sheets

(56) References Cited

U.S. PATENT DOCUMENTS

| | | |
|---|---|---|
| 2010/0085123 A1 | 4/2010 | Frans et al. |
| 2014/0380082 A1* | 12/2014 | Hossain ................. H03L 7/099 |
| | | 327/116 |
| 2015/0333740 A1 | 11/2015 | Kaviani et al. |
| 2018/0019706 A1 | 1/2018 | Hossain et al. |
| 2019/0028209 A1* | 1/2019 | Lu ............................ H03L 1/00 |
| 2019/0363702 A1* | 11/2019 | Kuo ....................... H04B 1/525 |
| 2019/0393882 A1* | 12/2019 | Bassi ................... H03K 3/0315 |

OTHER PUBLICATIONS

Heein Yoon et al., A-d31Bc Integrated-Phase-Noise 29GHz Fractional-N Frequency Synthesizer Supporting Multiple Frequency Bands for Backward-Compatible 5G Using a Frequency Doubler and Injection-Locked Frequency Multipliers, 2018 International Solid-State Circuits Conference—(ISSCC), IEEE, Feb. 11-15, 2018, pp. 366-368.

Extended European search report issued for the corresponding European patent application No. EP19957092.0, dated Aug. 18, 2023, 15 pages (for informational purposes only).

Search Report for the international application No. PCT/US2019/068638, dated Sep. 22, 2020, 4 pages (For reference purposes only).

\* cited by examiner

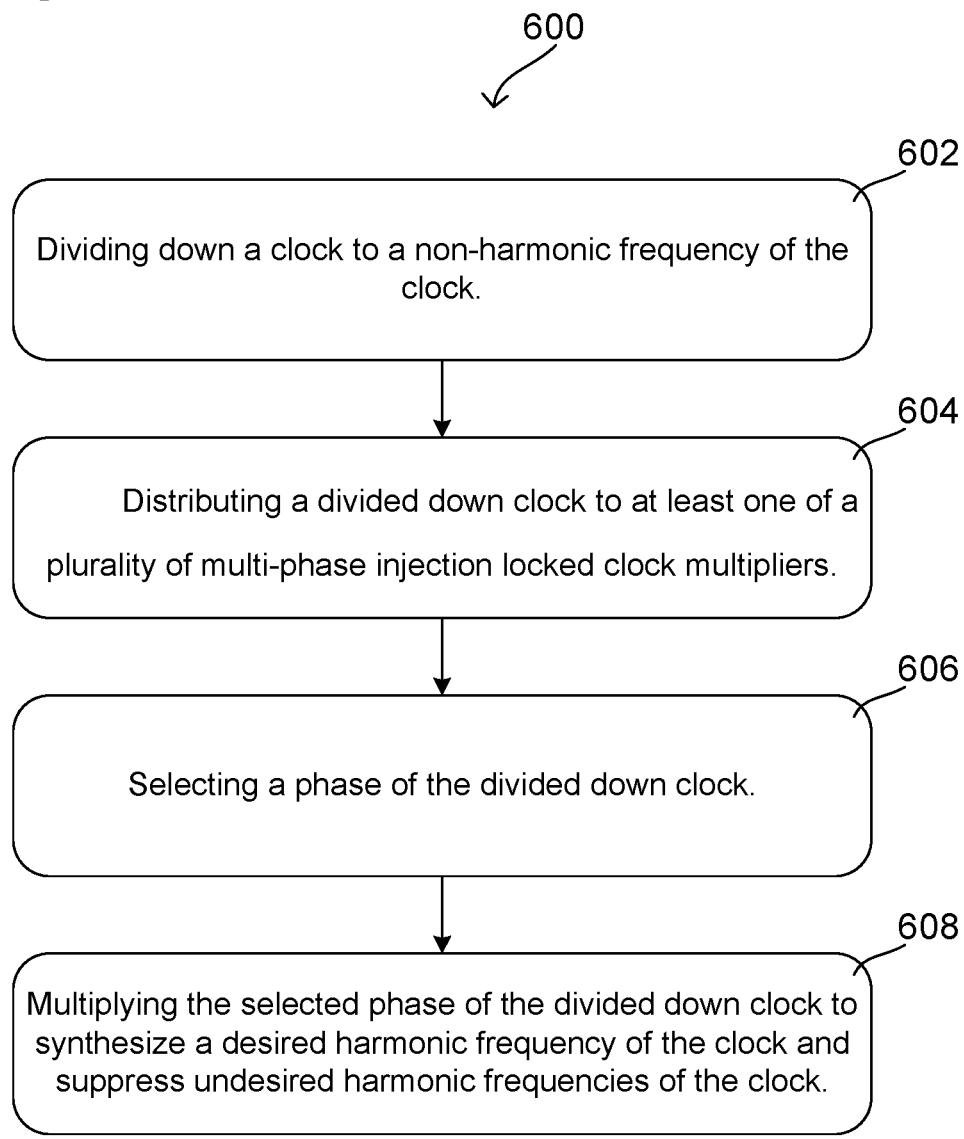

METHODS AND DEVICES FOR MITIGATING PULLING IN A FRACTIONAL LOCAL OSCILLATOR SIGNAL GENERATION SCHEME

RELATED APPLICATIONS

The present application is a national stage entry according to USC § 371 of PCT Application No. PCT/US2019/068638, filed on Dec. 27, 2019, which is incorporated by reference herein in its entirety.

TECHNICAL FIELD

Various aspects of the disclosure relate generally to methods and devices for reducing pulling when generating fractional local oscillator signals.

BACKGROUND

Power Amplifiers (PA) for use in User Equipment (UE) may be integrated on the same die for reasons of cost and form-factor. Oscillators, such as Digitally Controlled Oscillators (DCO) and Voltage Controlled Oscillators (VCO), may be very sensitive to disturbances from the PA that permeate through the substrate of the die due to electromagnetic coupling. They are particularly sensitive to disturbances with approximately the same frequency as the oscillator as well as its harmonics and sub-harmonics. Therefore, with the integration of the PA on the same die as the Radio Frequency (RF) transmitter, the oscillator in each Phase Locked Loop (PLL) can experience re-modulation or "pulling" from the high power modulated PA outputs. This pulling results in degraded modulation quality of the Error Vector Magnitude (EVM), spectral mask, and emissions. This problem is exacerbated with Transmission in a Multiple Inputs Multiple Output (MIMO) system, where the multiple independently modulated PAs at the same frequency can pull the oscillator in the RF PLL. It is desired to eliminate the PA pulling on the Oscillators.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 6 shows an exemplary flow chart of a method for LO generation and distribution according to some aspects.

DESCRIPTION

Figure 1A:
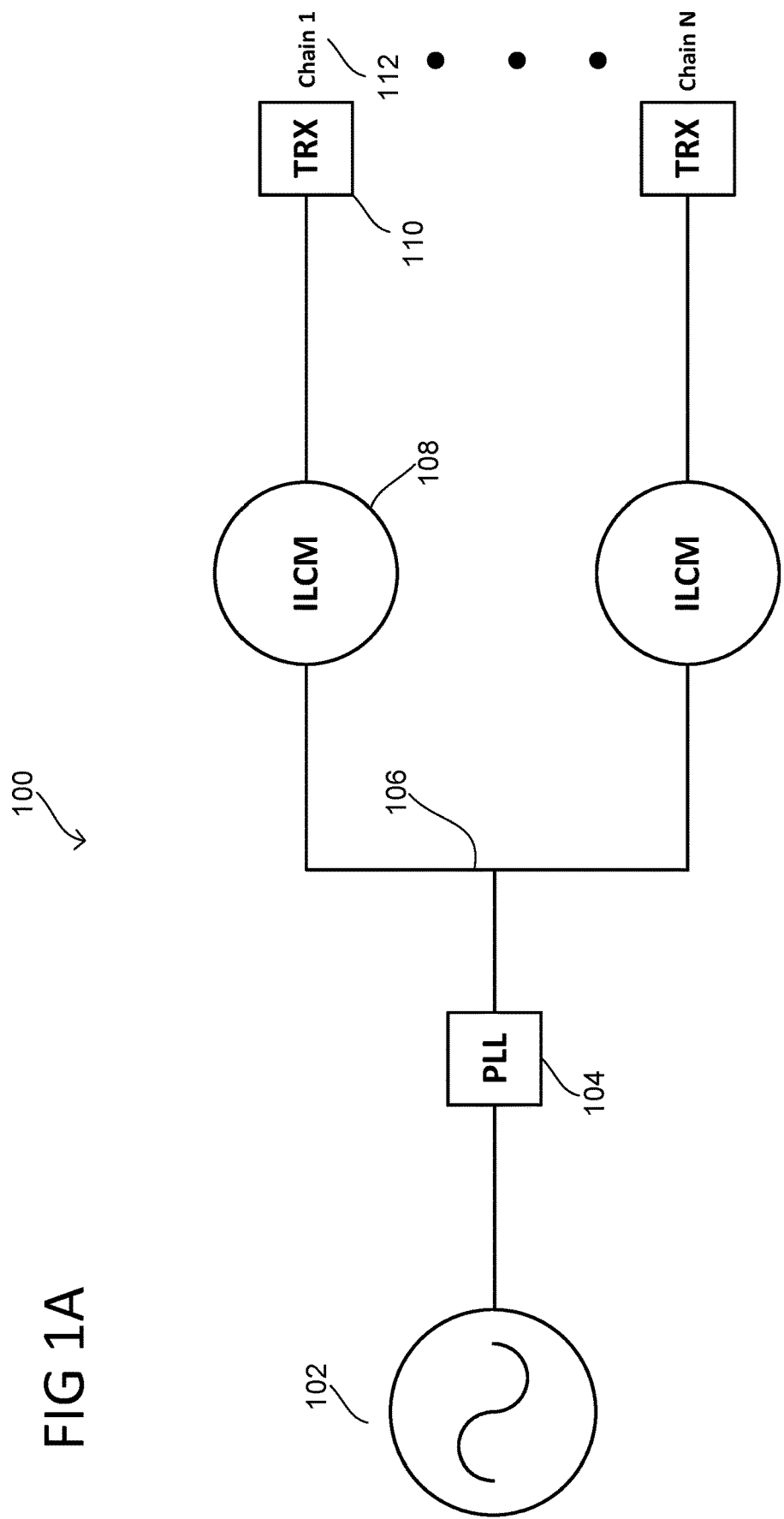
FIGS. 1A and 1B shows an exemplary Local Oscillator (LO) signal generation and distribution scheme according to some aspects.

The following detailed description refers to the accompanying drawings that show, by way of illustration, specific details and aspects of embodiments in which the invention may be practiced.

The word "exemplary" is used herein to mean "serving as an example, instance, or illustration." The words "plurality" and "multiple" in the description and claims refer to a quantity greater than one. The terms "group," "set", "sequence," and the like refer to a quantity equal to or greater than one. Any term expressed in plural form that does not expressly state "plurality" or "multiple" similarly refers to a quantity equal to or greater than one. The term "lesser subset" refers to a subset of a set that contains less than all elements of the set. Any vector and/or matrix notation utilized herein is exemplary in nature and is employed for purposes of explanation. Aspects of this disclosure described with vector and/or matrix notation are not limited to being implemented with vectors and/or matrices and the associated processes and computations may be performed in an equivalent manner with sets or sequences of data or other information.

As used herein, the term "software" refers to any type of executable instruction, including firmware.

Various aspects of this disclosure may utilize or be related to radio communication technologies. While some examples may refer to specific radio communication technologies, the examples provided herein may be similarly applied to various other radio communication technologies, both existing and not yet formulated, particularly in cases where such radio communication technologies share similar features as disclosed regarding the following examples. For purposes of this disclosure, radio communication technologies may be classified as one of a Short Range radio communication technology or Cellular Wide Area radio communication technology. Short Range radio communication technologies may include Bluetooth, WLAN (e.g., according to any IEEE 802.11 standard), and other similar radio communication technologies. Cellular Wide Area radio communication technologies may include Global System for Mobile Communications (GSM), Code Division Multiple Access 2000 (CDMA2000), Universal Mobile Telecommunications System (UNITS), Long Term Evolution (LTE), General Packet Radio Service (GPRS), Evolution-Data Optimized (EV-DO), Enhanced Data Rates for GSM Evolution (EDGE), High Speed Packet Access (HSPA; including High Speed Downlink Packet Access (HSDPA), High Speed Uplink Packet Access (HSUPA), HSDPA Plus (HSDPA+), and HSUPA Plus (HSUPA+)), Worldwide Interoperability for Microwave Access (WiMAX), 5G New Radio (NR), for example, and other similar radio communication technologies. Cellular Wide Area radio communication technologies also include "small cells" of such technologies, such as microcells, femtocells, and picocells. Cellular Wide Area radio communication technologies may be generally referred to herein as "cellular" communication technologies.

Unless explicitly specified, the term "transmit" encompasses both direct (point-to-point) and indirect transmission (via one or more intermediary points). Similarly, the term "receive" encompasses both direct and indirect reception. Furthermore, the terms "transmit", "receive", "communicate", and other similar terms encompass both physical transmission (e.g., the transmission of radio signals) and logical transmission (e.g., the transmission of digital data over a logical software-level connection). For example, a processor or controller may transmit or receive data over a software-level connection with another processor or controller in the form of radio signals, where the physical transmission and reception is handled by radio-layer components such as RF transceivers and antennas, and the logical transmission and reception over the software-level connection is performed by the processors or controllers.

Methods and devices, described in further detail below, are configured to generate and distribute non-harmonic LO clock to each transmit chain. By distributing a non-harmonic frequency, undesired pulling is mitigated. Subsequently the non-harmonic frequency is multiplied to synthesize a desired harmonic frequency. As a result, undesired spurs, phase noise, tuning range, and power dissipation are reduced.

Pulling may be eliminated by dividing down a clock of an RF using a DCO of a PLL. The fractional output of the PLL may be distributed to multiple MIMO transceiver chains to reduce LO distribution power dissipation. Having multi-phase injection locked oscillators (ILO) associated with each ILCM of each transceiver chain simultaneously achieves low power dissipation and low phase noise/spur performance in the harmonic multiplication of the divided down clock. Each harmonic multiplier includes a configurable multiplication ratio for each selected phase used for injection. The configurable multiplication ration reduces the necessary tuning range. By placing the ILOs close to each transceiver chain, the need for LO buffers is eliminated.

FIG. 1A depicts a LO generation scheme 100 according to some aspects, which may include PLL 104, divided down frequency 106, injection locked clock multiplier (ILCM) system 108, transceiver (TRX) 110, and transceiver chains 112. PLL 102 may include one or more dividers described in further detail in FIG. 2. ILCMs 108 may include one or more Injection Locked Oscillators (ILO) described in further detail in FIG. 3. ILCMs 108 are directly connected to transceiver chains 112. The number of transceiver chains in generation scheme 100 is exemplary and is scalable to any amount. LO generation scheme 100 may be applicable to both transmission and reception of signals.

The proposed scheme for LO generation is shown in FIG. 1A. We propose a DCO or VCO as part of PLL 104 that is designed to generate a frequency that is a fractional non-harmonic multiple of the RF 102. The DCO or VCO of PLL 104 may be reconfigured to generate different fractions of the frequency, which reduces the required tuning range in the DCO or VCO.

Once the RF 102 band is divided down to a fractional non-harmonic frequency signal 106, it may be distributed at a lower frequency over long distances on the chip. For example, to different transceiver chains 112. Transceiver chains 112 may be MIMO. ILCMs 108 are directly connected to each of the transceiver chains 112. ILCMs 108 are configured to multiply the frequency up using a reconfigurable ILO.

Figure 1B:
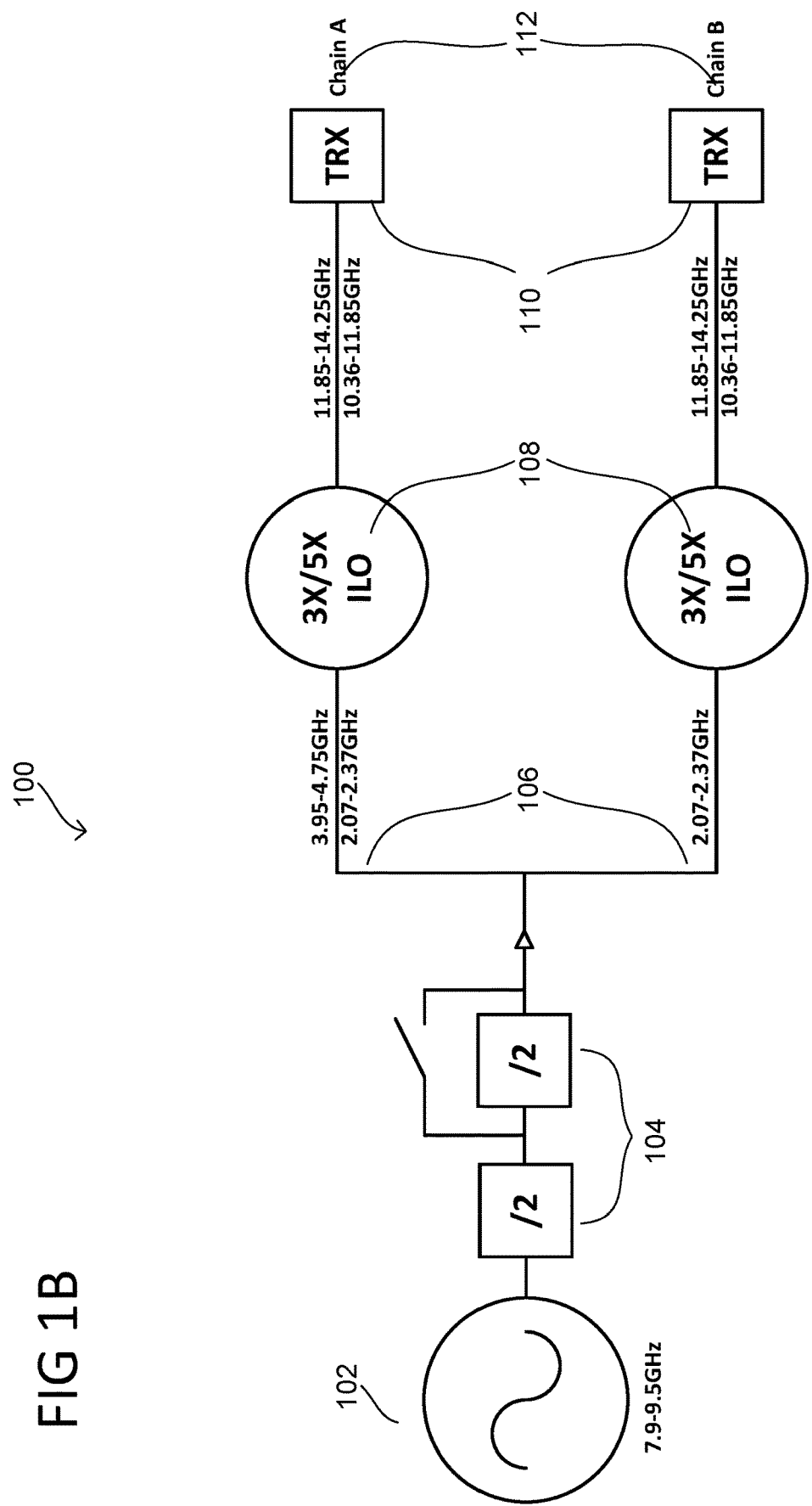

An example of LO generation scheme 100 used to cover the entire Wi-Fi high band range from 5.18-7.125 GHz is depicted in FIG. 1B. A DCO of PLL 104 may be run at a non-harmonic frequency of such as 4/3× or 8/5× of an RF frequency (7.9-9.5 GHZ). The non-harmonic frequency is then divided down. PLL 104 may be configured to divide down the RF clock by 2 (3.95-4.75 GHz) or 4 (2.07-2.37). The divided down clock may be distributed to transceiver chains 112. The divided down clock is applied to ILO 306 (described in further detail below) of ILCM 108 ILCMs 108, which is to multiply the divided down clock by 3× or to generate 2×LO of the RF frequency.

For example, if the DCO is run at 4/3× of the RF frequency (7.9-9.5 GHz) and divided by 2 (3.95-4.75 GHz), then distributed to a 3×ILO multiplier, the LO generation scheme will generate 2× the RF frequency (11.85-14.25 GHz).

As another example, if the DCO is run at 8/5× of the RF frequency (8.3-9.5 GHz) and divided by 4 (2.07-2.37 GHz), then distributed to a 5× ILO multiplier, the LO generation scheme will generate 2× the RF frequency (10.36-11.85 GHz).

Figure 2:
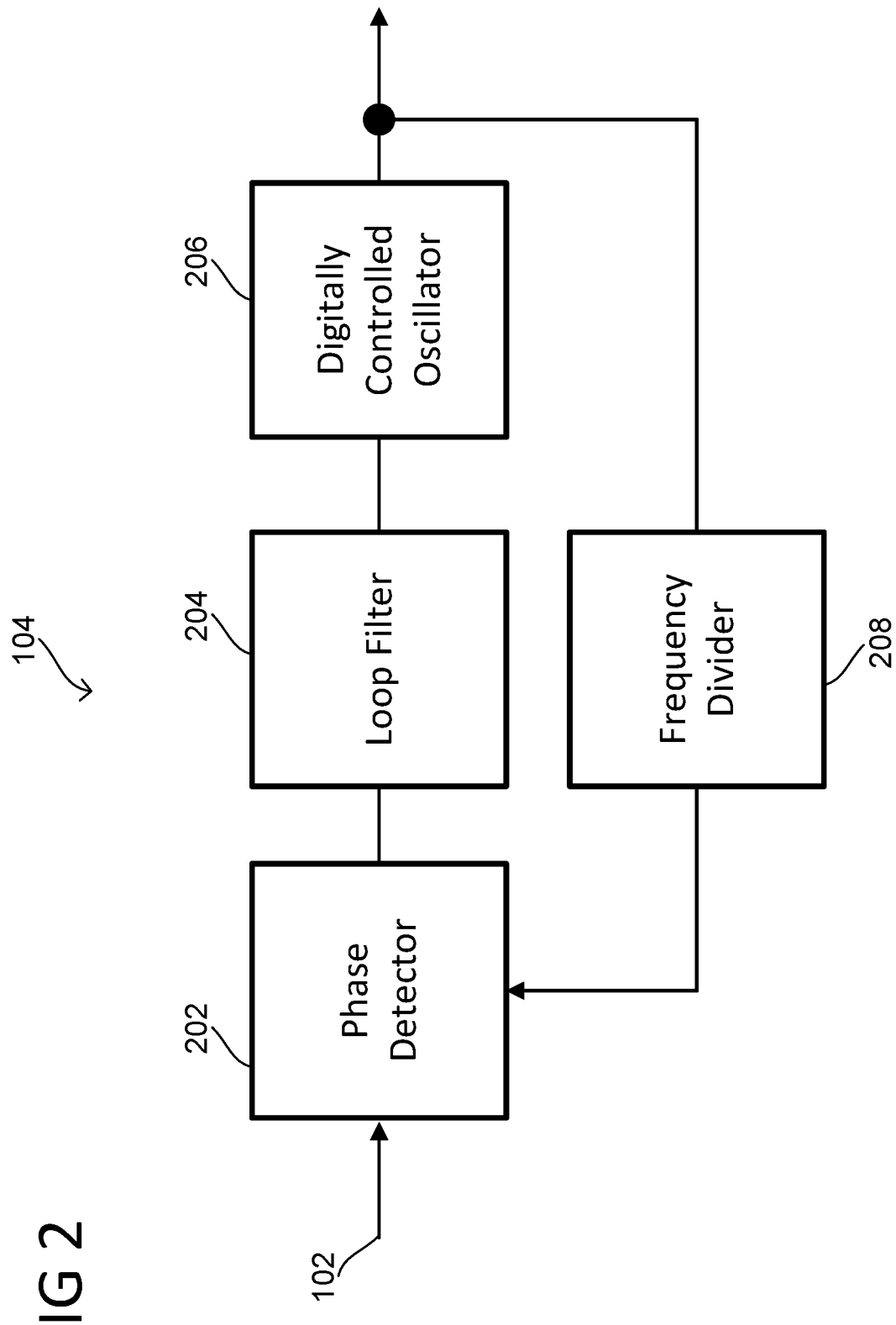
FIG. 2 shows an exemplary Phase Locked Loop according to some aspects.

FIG. 2 depicts an exemplary PLL 104 used within generation scheme 100, which may include phase detector 202, loop filter 204, DCO 206, and frequency divider 208. PLL 104 is configured to divide down RF 102 to a sub-harmonic frequency to eliminate or minimize pulling. For example, pulling from a PA integrated on the same chip. RF 102 is input into PLL 104 at phase detector 202 to determine the phase difference between the RF signal and the signal from the feedback loop. Phase detector 202 distributes the phase difference to loop filter 204 before being distribution to DCO 206. It should be noted that PLL 104 could use other oscillators such as a VCO. DCO 206 generates the divided down non-harmonic frequency signal 106 as output signal which is distributed to at least one ILCM 108 of transceiver chain 112.

By dividing down RF 102, LO may be distributed at lower frequencies across the chip. The DCO 206 in the PLL 104 may be designed for optimum phase-noise reduction without incurring extra Q phase degradation for a quadrature phase-shifted LO for a wide tuning range.

Frequency dividers 208 in the feedback loop of PLL 104 may be complementary metal-oxide semiconductor (CMOS) or current-mode logic (CML) dividers.

Figure 3:
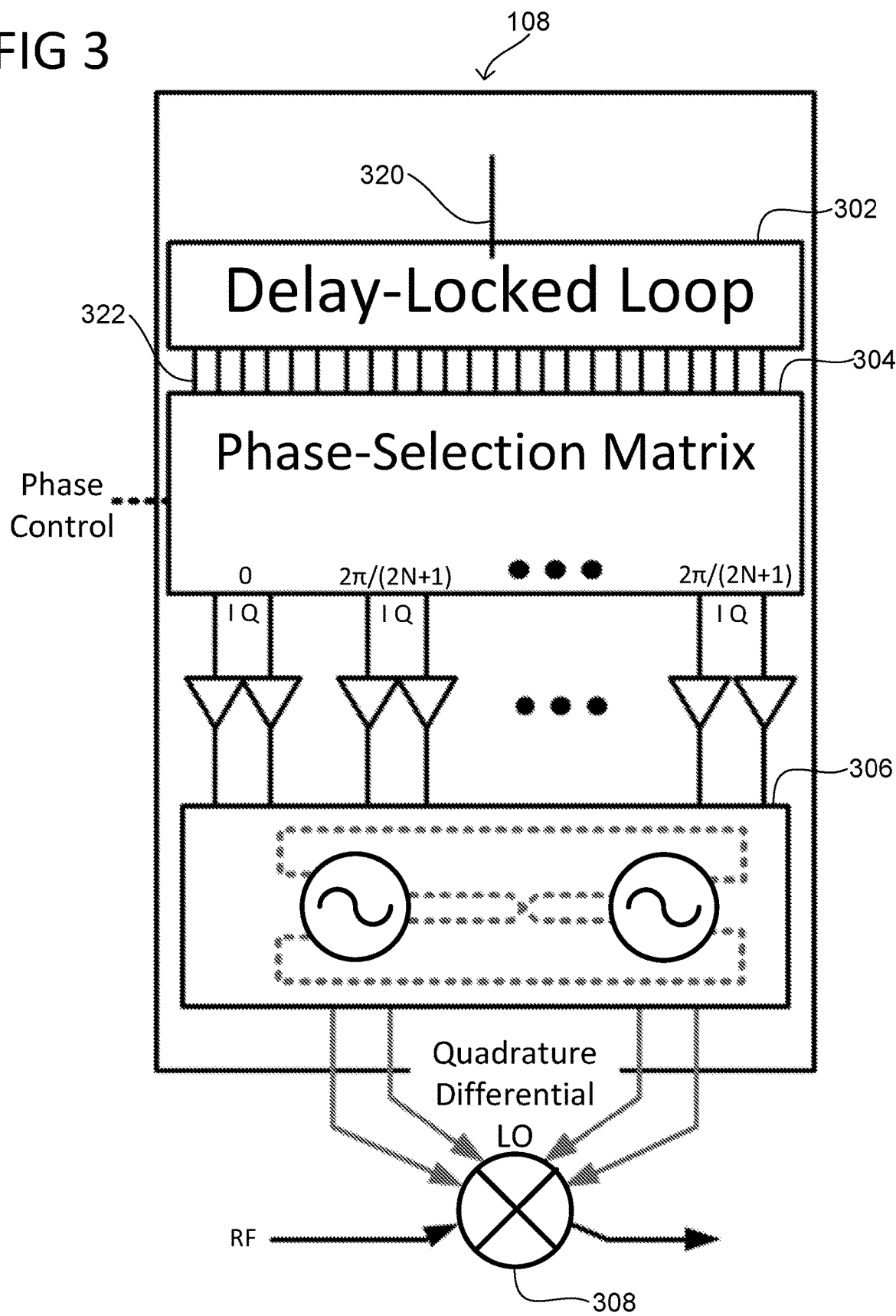
FIG. 3 shows an exemplary Injection Locked Clock Multiplier according to some aspects.

FIG. 3 depicts an exemplary delay locked loop (DLL) 302 included in ILCM 108. DLL 302 is used to generate equally spaced phases of a RF required as an input into phase selection matrix 304. DLL 302 may be implemented as a multi-stage controlled delay-line. In an aspect, the DLL 302 may generate a multi-phase input to phase selection matrix 304 described in further detail below. Further in accordance with such aspects, the DLL 302 may include a phase-detector and loop filter, which may be implemented, for example, as one or more processors configured to execute computer-readable instructions to control a state of one or more of M number of delay elements included in the M-stage controlled delay-line. The M-stage controlled delay-line implements inverters as delay elements, aspects include the M-stage controlled delay-line being implemented with any suitable type and/or combination of delay elements such as buffers, for example.

In an aspect, phase-detector and loop filter may facilitate analog and/or digital control over the M-stage controlled delay-line, which may be tuned to ensure that the delay-line input and output are separated by one clock period. The clock signal may include, for instance, the distributed input signal generated by a common phase locked loop (PLL). Furthermore, the phase-detector and loop filter may control the state of the delay elements implemented by the M-stage controlled delay-line using any suitable techniques, such as via load control, current starving control, power supply control, etc.

Aspects include DLL 302 generating phase-shifted signals, as shown in FIG. 3, separated by a phase that is a function of the number M of delay elements. Thus, the unit-phase granularity associated with an amount of phase-shift between the set of phase-shifted signals 322 provided by the DLL 302 (i.e., the "CLK Phases") is increased with the number M of delay elements. However, the DLL 302 is limited in that the unit phase-shift ($2\pi/M$) equivalent time-delay, in some instances, may decrease beyond a unit inverter delay of an individual delay element. Therefore, to allow for a finer granularity of unit-phase shift, aspects include implementing alternate types of delay lines.

FIG. 3 depicts an exemplary ILCM 108 system used within generation scheme 100, which may include delay locked loop (DLL) 302, phase selection matrix 304, injection locked oscillators (ILO) 306, mixer 308. ILCM 108 may utilize DLL 302 to generate multi-phase sub-harmonic clocks 322 based on the locked non-harmonic signal 106. Each ILCM generally includes one ILO 306. Alternatively, the sub-harmonic multiphase clocks 322 may be generated based on a DTC not shown in FIG. 3. The DLL 302 or DTC may provide equally spaced phase shifted clocks covering the 360° phase space in order to multiply the frequency by an odd factor. The phase selection matrix 304 chooses the appropriate phase for clock multiplication and the effective phase shift required for the intended frequency. The phase selection matrix 304 may be reconfigurable to determine a subset of the multi-phase sub-harmonic clocks 322 are injected into the ILO 306. This allows us to re-configure the multiplication ratio for example. These multi-phase sub-harmonic clocks 322 are injected the ILO 306 of ILCM 108 at an mm-Wave oscillator, which is tuned to a frequency extremely close to our intended LO frequency. The LO frequency output can be directly applied to mixer 308. Mixer 308 may be a passive mixer or an active mixer. Alternatively, the output may drive the transceiver 110 of transceiver chain 112.

As a non-limiting example, the mm-Wave oscillator of ILO 306 may be tuned to within 100 MHz of the intended LO frequency. However, an mm-Wave oscillators tuned to any frequency that is sufficient to produce locking works.

For example, as shown in FIG. 3, ILO 306 is configured to generate 2*LO. The 2*LO may be applied to a divider (not shown) to create quadrature phase-shifted LO signals. Alternatively, the 2*LO may be applied to a DTC configured to operate at 2*LO.

Local DLLs 302 or DTCs may provide a simple way to generate multiple phases, such as phases for a quadrature phase-shifted LO, at LO sub-harmonic for multiplication in ILCM 108. The injection mechanism for ILOs 306 suppresses undesired harmonics, which generates a reduced noise spectrum.

By directly connecting the ILCMs 108 to transceiver chains 112, the need for LO buffers is eliminated. For example, ILCMs 108 may be placed within 100 micrometers from transceiver chains 112. Additionally, the capacitive load of the mixer may be absorbed by the quadrature oscillator system as fixed capacitance, eliminating the need for any additional buffers.

Figure 4A:
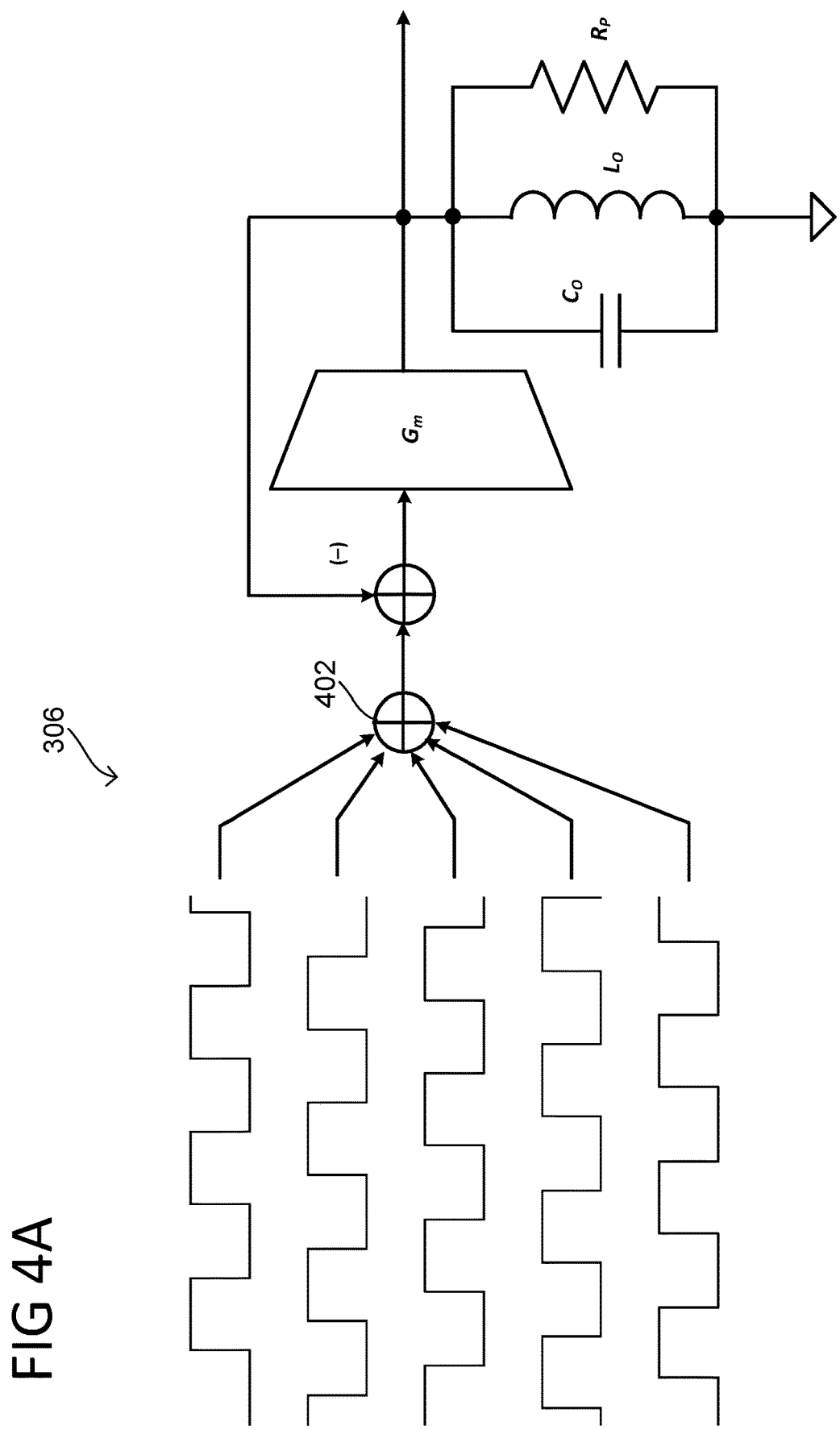
FIGS. 4A and 4B show exemplary Multi-Phase Injection Oscillators according to some aspects.
Figure 4B:
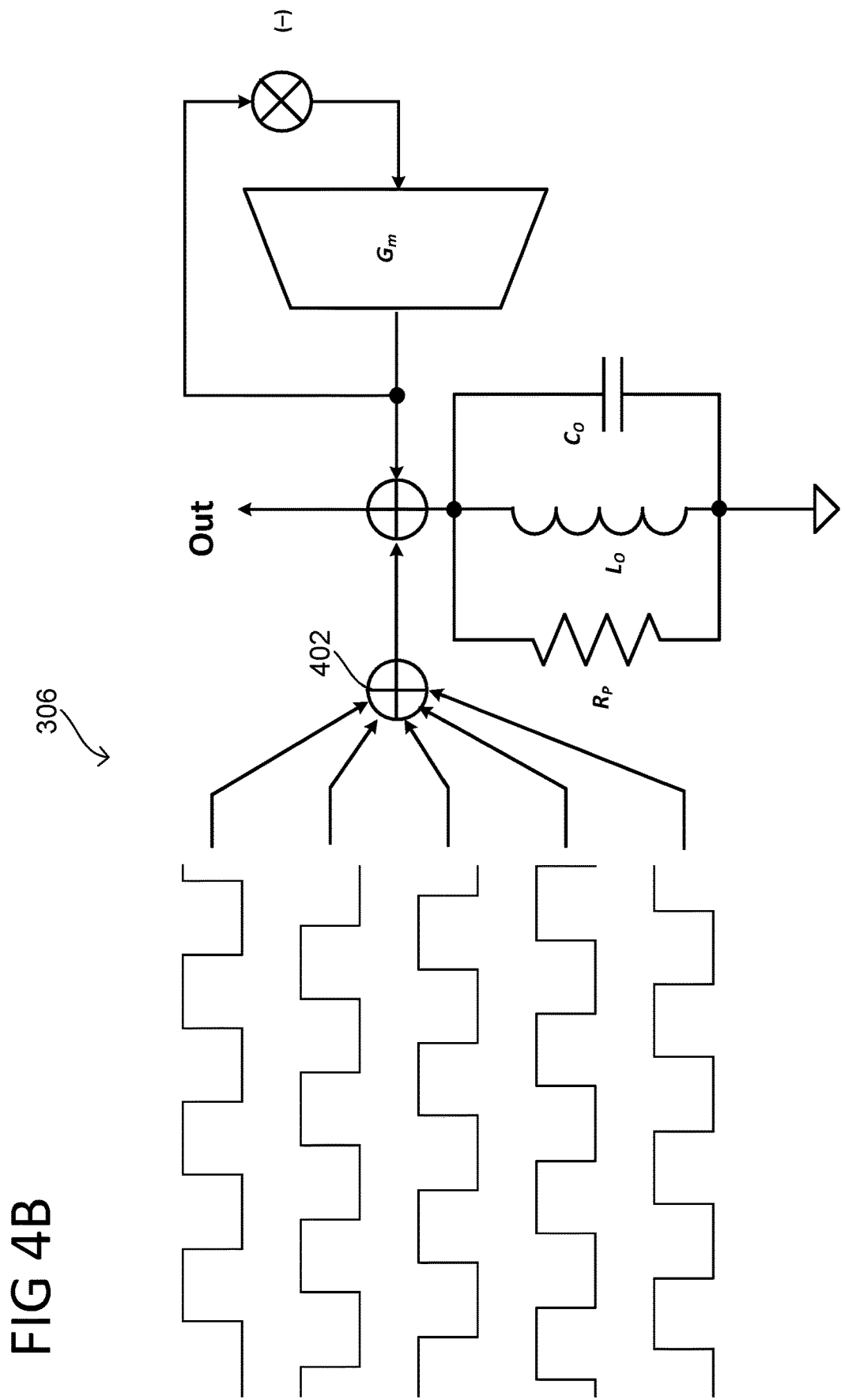

FIGS. 4A and 4B depict phase clocks being injected into a mm-Wave oscillator 402 of ILO 306 in an ILCM 108 system. Injection locking may be accomplished in a number of ways. For example, FIG. 4A depicts an in series injection locking ILO. As another example, FIG. 4B depicts an in parallel injection locking ILO.

The ILOs 306 may be injected with a clock having any number of phases. For example, a 5-phase clock is described below. FIGS. 4A and 4B depict injection of a 5-phase clock at $f_{LO}/5$ where $2\pi/f_{LO} \approx 1/\sqrt{(L_0 \cdot C_0)}$. For a 5-phase clock, the phase noise of the injected signal is up-converted by a factor of 20*log 10(5)=14 dB at the output of the ILCM 108 system. For clocks with a different number of phases, a more generic expression for the multiplication factor would be 20*log 10(2N+1).

Figure 5:
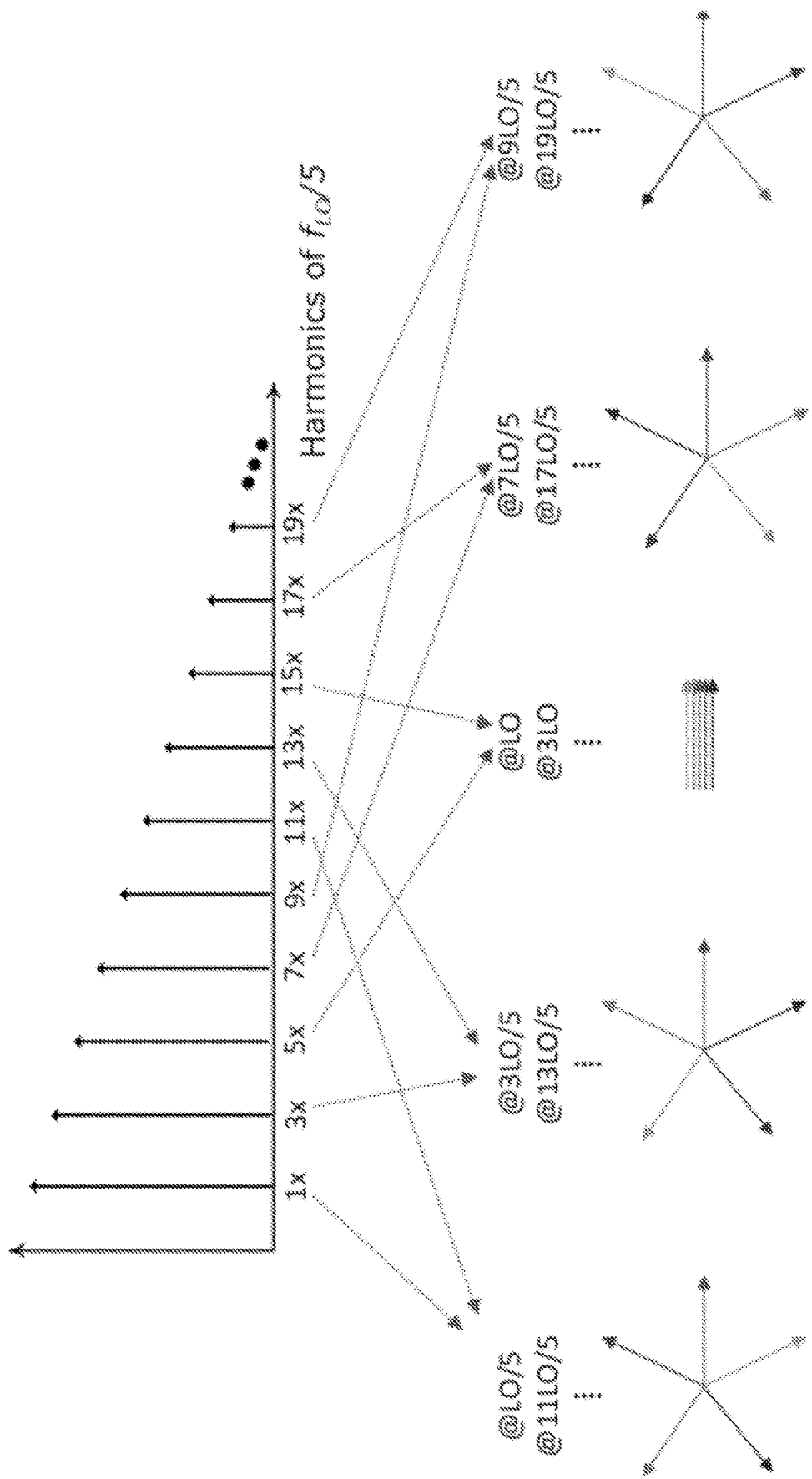
FIG. 5 shows an exemplary depiction of desired harmonics and of undesired harmonics according to some aspects.

FIG. 5 depicts the phenomenon of which harmonics of a 5-phase clock combine constructively and which ones combine destructively. For example, multiplication of the 5-phase clocks at LO/5 frequency combine constructively at LO frequency and its harmonics such as 2LO, 3LO, 4LO, etc. They combine destructively at LO/5 and all of its remaining harmonics, such as 2LO/5, 3LO/5, 4LO/5, 6LO/5, 7 LO/5, etc. By removing the undesired harmonics of LO/5, the output of the proposed ILCM 108 system is unaffected or minimally affected by pulling.

FIG. 6 depicts an exemplary method 600 of generating a synthesized clock. As shown in FIG. 6, method 600 includes dividing down a clock to a non-harmonic frequency of the clock (602), distributing a divided down clock to at least one of a plurality of multi-phase injection locked clock multipliers (604), selecting a phase of the divided down clock (606), multiplying the selected phase of the divided down clock to synthesize a desired harmonic frequency of the clock and suppress undesired harmonic frequencies of the clock (608).

While the above descriptions and connected figures may depict electronic device components as separate elements, skilled persons will appreciate the various possibilities to combine or integrate discrete elements into a single element. Such may include combining two or more circuits for form a single circuit, mounting two or more circuits onto a common chip or chassis to form an integrated element, executing discrete software components on a common processor core, etc. Conversely, skilled persons will recognize the possibility to separate a single element into two or more discrete elements, such as splitting a single circuit into two or more separate circuits, separating a chip or chassis into discrete elements originally provided thereon, separating a software component into two or more sections and executing each on a separate processor core, etc.

It is appreciated that implementations of methods detailed herein are demonstrative in nature, and are thus understood as capable of being implemented in a corresponding device. Likewise, it is appreciated that implementations of devices detailed herein are understood as capable of being implemented as a corresponding method. It is thus understood that a device corresponding to a method detailed herein may include one or more components configured to perform each aspect of the related method.

All acronyms defined in the above description additionally hold in all claims included herein.

The following examples disclose various aspects of this disclosure:

Example 1 is a radio-frequency integrated circuit (RFIC) configured to generate a synthesized clock including a phase locked loop (PLL) configured to divide down a clock to a non-harmonic frequency of the clock; a plurality of multi-phase injection locked clock multipliers (ILCM) connected to a plurality of transceiver chains, wherein each ILCM is connected with an associated one transceiver chain of the plurality of transceiver chains; wherein the PLL is further configured to distribute a divided down clock to at least one of the plurality of multi-phase ILCMs; wherein the plurality of multi-phase ILCMs are configured to select a phase of the divided down clock and multiply the divided down clock to synthesize a desired harmonic frequency of the clock and suppress an undesired harmonic frequency of the clock.

In example 2, the subject matter of Example 1 can optionally further include wherein the PLL further comprises a voltage controlled oscillator (VCO).

In example 3, the subject matter of Example 1 can optionally further include wherein the PLL further comprises a digitally controlled oscillator (DCO).

In example 4, the subject matter of any of Examples 1-3 can optionally further include wherein the PLL further comprises a divider.

In example 5, the subject matter of Example 4 can optionally further include wherein the divider is a complementary metal-oxide semiconductor (CMOS) frequency divider.

In example 6, the subject matter of Example 4 can optionally further include wherein the divider is a current-mode logic (CML) frequency divider.

In example 7, the subject matter of any of Examples 5 or 6 can optionally further include further comprising a plurality of dividers.

In example 8, the subject matter of Example 4 can optionally further include wherein a fractional multiple for dividing down the clock is configurable.

In example 9, the subject matter of any of Examples 1-3 can optionally further include wherein at least some of the transceiver chains are Multiple Input/Multiple Output (MIMO) transceiver chains.

In example 10, the subject matter of any of Examples 1-3 can optionally further include wherein each of the plurality of ILCMs comprise a multi-phase injection locked oscillator (ILO).

In example 11, the subject matter of any of Examples 1-3 can optionally further include wherein a multiplication ratio for multiplying the divided down clock is configurable.

In example 12, the subject matter of any of Examples 1-3 can optionally further include wherein an output of the plurality of ILCMs is directly connected to a mixer of the plurality of transceiver chains.

In example 13, the subject matter of Example 12 can optionally further include wherein the mixer of the plurality of transceiver chains is an active mixer.

In example 14, the subject matter of Example 12 can optionally further include wherein the mixer of the plurality of transceiver chains is a passive mixer.

In example 15, the subject matter of Example 10 can optionally further include wherein the multi-phase ILO is configured in series.

In example 16, the subject matter of Example 10 can optionally further include wherein the multi-phase ILO is configured in parallel.

In example 17, the subject matter of any of Examples 1-3 can optionally further include wherein the plurality of ILCMs comprise a delayed locked loop (DLL) configured to generate a plurality of multi-phase sub-harmonic clocks.

In example 18, the subject matter of any of Examples 1-3 can optionally further include wherein the plurality of ILCMs comprise a digital-to-time converter (DTC) configured to generate a plurality of multi-phase sub-harmonic clocks.

In example 19, the subject matter of any of Examples 17 or 18 can optionally further include wherein the plurality of multi-phase sub-harmonic clocks are equally spaced across a 360 degree phase space.

In example 20, the subject matter of any of Examples 15 or 16 can optionally further include wherein the ILO comprises an mm-Wave oscillator.

In example 21, the subject matter of Example 20 can optionally further include wherein the mm-Wave oscillator is configured to a frequency of an intended clock frequency.

In example 22, the subject matter of any of Examples 17 or 18 can optionally further include wherein the plurality of ILCMs comprise a phase selection matrix to determine an appropriate phase from the plurality of multi-phase sub-harmonic clocks.

In example 23, the subject matter of any of Examples 1-22 can optionally further include wherein the plurality of transceiver chains comprise a digital-to-time converter (DTC).

In example 24, the subject matter of any of Examples 1-23 can optionally further include wherein the plurality of ILCMs comprise two oscillators configured to generate a quadrature phase-shifted clock.

Example 25 is a system for generating a synthesized clock including a phase locked loop (PLL) configured to divide down a clock to a non-harmonic frequency of the clock; a plurality of multi-phase injection locked clock multipliers (ILCM) connected to a plurality of transceiver chains, wherein each ILCM is connected with an associated one transceiver chain of the plurality of transceiver chains; wherein the PLL is further configured to distribute a divided down clock to at least one of the plurality of multi-phase ILCMs; wherein the plurality of multi-phase ILCMs are configured to select a phase of the divided down clock and multiply the divided down clock to synthesize a desired harmonic frequency of the clock and suppress an undesired harmonic frequency of the clock.

In example 26, the subject matter of Example 25 can optionally further include wherein the PLL further comprises a voltage controlled oscillator (VCO).

In example 27, the subject matter of Example 25 can optionally further include wherein the PLL further comprises a digitally controlled oscillator (DCO).

In example 28, the subject matter of any of Examples 25-27 can optionally further include wherein the PLL further comprises a divider.

In example 29, the subject matter of Example 27 can optionally further include wherein the divider is a complementary metal-oxide semiconductor (CMOS) frequency divider.

In example 30, the subject matter of Example 27 can optionally further include wherein the divider is a current-mode logic (CML) frequency divider.

In example 31, the subject matter of any of Examples 29 or 30 can optionally further include further comprising a plurality of dividers.

In example 32, the subject matter of Example 27 can optionally further include wherein a fractional multiple for dividing down the clock is configurable.

In example 33, the subject matter of any of Examples 25-27 can optionally further include wherein at least some of the transceiver chains are Multiple Input/Multiple Output (MIMO) transceiver chains.

In example 34, the subject matter of any of Examples 25-27 can optionally further include wherein each of the plurality of ILCMs comprise a multi-phase injection locked oscillator (ILO).

In example 35, the subject matter of any of Examples 25-27 can optionally further include wherein a multiplication ratio for multiplying the divided down clock is configurable.

In example 36, the subject matter of any of Examples 25-27 can optionally further include wherein an output of the plurality of ILCMs is directly connected to a mixer of the plurality of transceiver chains.

In example 37, the subject matter of Example 36 can optionally further include wherein the mixer of the plurality of transceiver chains is an active mixer.

In example 38, the subject matter of Example 36 can optionally further include wherein the mixer of the plurality of transceiver chains is a passive mixer.

In example 39, the subject matter of Example 34 can optionally further include wherein the multi-phase ILO is configured in series.

In example 40, the subject matter of Example 34 can optionally further include wherein the multi-phase ILO is configured in parallel.

In example 41, the subject matter of any of Examples 25-27 can optionally further include wherein the plurality of ILCMs comprise a delayed locked loop (DLL) configured to generate a plurality of multi-phase sub-harmonic clocks.

In example 42, the subject matter of any of Examples 25-27 can optionally further include wherein the plurality of ILCMs comprise a digital-to-time converter (DTC) configured to generate a plurality of multi-phase sub-harmonic clocks.

In example 43, the subject matter of any of Examples 41 or 42 can optionally further include wherein the plurality of multi-phase sub-harmonic clocks are equally spaced across a 360 degree phase space.

In example 44, the subject matter of any of Examples 39 or 40 can optionally further include wherein the ILO comprises an mm-Wave oscillator.

In example 45, the subject matter of Example 44 can optionally further include wherein the mm-Wave oscillator is configured to a frequency of an intended clock frequency.

In example 46, the subject matter of any of Examples 41 or 42 can optionally further include wherein the plurality of ILCMs comprise a phase selection matrix to determine an appropriate phase from the plurality of multi-phase sub-harmonic clocks.

In example 47, the subject matter of any of Examples 25-46 can optionally further include wherein the plurality of transceiver chains comprise a digital-to-time converter (DTC).

In example 48, the subject matter of any of Examples 25-48 can optionally further include wherein the plurality of ILCMs comprise two oscillators configured to generate a quadrature phase-shifted clock.

Example 49 is a means for generating a synthesized clock including a phase locked loop (PLL) configured to divide down a clock to a non-harmonic frequency of the clock; a plurality of multi-phase injection locked clock multipliers (ILCM) connected to a plurality of transceiver chains, wherein each ILCM is connected with an associated one transceiver chain of the plurality of transceiver chains; wherein the PLL is further configured to distribute a divided down clock to at least one of the plurality of multi-phase ILCMs; wherein the plurality of multi-phase ILCMs are configured to select a phase of the divided down clock and multiply the divided down clock to synthesize a desired harmonic frequency of the clock and suppress an undesired harmonic frequency of the clock.

In example 50, the subject matter of Example 49 can optionally further include wherein the PLL further comprises a voltage controlled oscillator (VCO).

In example 51, the subject matter of Example 49 can optionally further include wherein the PLL further comprises a digitally controlled oscillator (DCO).

In example 52, the subject matter of any of Examples 49-51 can optionally further include wherein the PLL further comprises a divider.

In example 53, the subject matter of Example 52 can optionally further include wherein the divider is a complementary metal-oxide semiconductor (CMOS) frequency divider.

In example 54, the subject matter of Example 52 can optionally further include wherein the divider is a current-mode logic (CML) frequency divider.

In example 55, the subject matter of any of Examples 53 or 54 can optionally further include further comprising a plurality of dividers.

In example 56, the subject matter of Example 52 can optionally further include wherein a fractional multiple for dividing down the clock is configurable.

In example 57, the subject matter of any of Examples 49-51 can optionally further include wherein at least some of the transceiver chains are Multiple Input/Multiple Output (MIMO) transceiver chains.

In example 58, the subject matter of any of Examples 49-51 can optionally further include wherein each of the plurality of ILCMs comprise a multi-phase injection locked oscillator (ILO).

In example 59, the subject matter of any of Examples 49-51 can optionally further include wherein a multiplication ratio for multiplying the divided down clock is configurable.

In example 60, the subject matter of any of Examples 49-51 can optionally further include wherein an output of the plurality of ILCMs is directly connected to a mixer of the plurality of transceiver chains.

In example 61, the subject matter of Example 60 can optionally further include wherein the mixer of the plurality of transceiver chains is an active mixer.

In example 62, the subject matter of Example 60 can optionally further include wherein the mixer of the plurality of transceiver chains is a passive mixer.

In example 63, the subject matter of Example 58 can optionally further include wherein the multi-phase ILO is configured in series.

In example 64, the subject matter of Example 58 can optionally further include wherein the multi-phase ILO is configured in parallel.

In example 65, the subject matter of any of Examples 49-51 can optionally further include wherein the plurality of ILCMs comprise a delayed locked loop (DLL) configured to generate a plurality of multi-phase sub-harmonic clocks.

In example 66, the subject matter of any of Examples 49-51 can optionally further include wherein the plurality of ILCMs comprise a digital-to-time converter (DTC) configured to generate a plurality of multi-phase sub-harmonic clocks.

In example 67, the subject matter of any of Examples 65 or 66 can optionally further include wherein the plurality of multi-phase sub-harmonic clocks are equally spaced across a 360 degree phase space.

In example 68, the subject matter of any of Examples 63 or 64 can optionally further include wherein the ILO comprises an mm-Wave oscillator.

In example 69, the subject matter of Example 68 can optionally further include wherein the mm-Wave oscillator is configured to a frequency of an intended clock frequency.

In example 70, the subject matter of any of Examples 65 or 66 can optionally further include wherein the plurality of ILCMs comprise a phase selection matrix to determine an appropriate phase from the plurality of multi-phase sub-harmonic clocks.

In example 71, the subject matter of any of Examples 49-70 can optionally further include wherein the plurality of transceiver chains comprise a digital-to-time converter (DTC).

In example 72, the subject matter of any of Examples 49-71 can optionally further include wherein the plurality of ILCMs comprise two oscillators configured to generate a quadrature phase-shifted clock.

Example 73 is a method for generating a synthesized clock including dividing down a clock to a non-harmonic frequency of the clock; distributing a divided down clock to at least one of a plurality of multi-phase ILCMs; selecting a phase of the divided down clock and multiplying the divided down clock to synthesize a desired harmonic frequency of the clock and suppress an undesired harmonic frequency of the clock.

In example 74, the subject matter of Example 73 can optionally further include further comprising a configurable fractional multiple for dividing down the clock.

In example 75, the subject matter of any of Examples 73 or 74 can optionally further include further comprising a configurable ratio for multiplying the divided down clock.

In example 76, the subject matter of any of Examples 73-75 can optionally further include further comprising generating a plurality of multi-phase sub-harmonic clocks of the divided down clock.

In example 77, the subject matter of any of Examples 73-76 can optionally further include further comprising generating the synthesized clock at an intended clock frequency.

In example 78, the subject matter of any of Examples 73-77 can optionally further include further comprising selecting an appropriate phase from the plurality of multi-phase sub-harmonic clocks.

In example 79, the subject matter of any of Examples 73-78 can optionally further include further comprising generating a quadrature phase-shifted clock.

Example 80 is a non-transitory computer readable medium storing instructions thereon, that when executed by one or more processors of an RFIC, cause the RFIC to perform the method of any one of Examples 72 to 79.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A radio-frequency integrated circuit (RFIC) configured to generate a synthesized clock comprising:
    a phase locked loop (PLL) configured to divide down a clock to a non-harmonic frequency of the clock;
    a plurality of multi-phase injection locked clock multipliers (ILCM) connected to a plurality of transceiver chains, wherein each of the plurality of multi-phase ILCM is connected with an associated transceiver chain of the plurality of transceiver chains;
    wherein the PLL is further configured to distribute a divided down clock to at least one of the plurality of multi-phase ILCMs;
    wherein each of the plurality of multi-phase ILCMs is configured to select a phase of the divided down clock and multiply the divided down clock to synthesize a desired harmonic frequency of the clock; and
    wherein each of the plurality of ILCMs comprises a multi-phase injection locked oscillator (ILO) configured to suppress an undesired harmonic frequency of the clock.

2. The RFIC of claim 1, wherein the PLL further comprises a voltage controlled oscillator (VCO).

3. The RFIC of claim 1, wherein the PLL further comprises a digitally controlled oscillator (DCO).

4. The RFIC claim 1, wherein the PLL further comprises a divider.

5. The RFIC of claim 4, wherein the divider is a complementary metal-oxide semiconductor (CMOS) frequency divider.

6. The RFIC of claim 4, wherein the divider is a current-mode logic (CML) frequency divider.

7. The RFIC of claim 1, further comprising a plurality of dividers.

8. The RFIC of claim 4, wherein a fractional multiple for dividing down the clock is configurable.

9. The RFIC of claim 1, wherein at least one of the transceiver chains is a Multiple Input/Multiple Output (MIMO) transceiver chain.

10. The RFIC of claim 1, wherein a multiplication ratio for multiplying the divided down clock is reconfigurable.

11. The RFIC of claim 1, wherein an output of the plurality of ILCMs is directly connected to a mixer of the plurality of transceiver chains.

12. The RFIC of claim 11, wherein the mixer of the plurality of transceiver chains is an active mixer.

13. The RFIC of claim 11, wherein the mixer of the plurality of transceiver chains is a passive mixer.

14. The RFIC of claim 1, wherein the multi-phase ILO is configured in series.

15. The RFIC of claim 1, wherein the multi-phase ILO is configured in parallel.

16. The RFIC of claim 1, wherein each of the plurality of ILCMs comprises a delayed locked loop (DLL) configured to generate a plurality of multi-phase sub-harmonic clocks.

17. The RFIC of claim 1, wherein each of the plurality of ILCMs comprises a digital-to-time converter (DTC) configured to generate a plurality of multi-phase sub-harmonic clocks.

18. The RFIC of claim 16, wherein the plurality of multi-phase sub-harmonic clocks are equally spaced across a 360 degree phase space.

19. The RFIC of claim 14, wherein the ILO comprises an mm-Wave oscillator.

20. The RFIC of claim 19, wherein the mm-Wave oscillator is configured a frequency of an intended clock frequency.

* * * * *